(12) United States Patent
Krivokapic

(10) Patent No.: US 6,501,135 B1
(45) Date of Patent: Dec. 31, 2002

(54) GERMANIUM-ON-INSULATOR (GOI) DEVICE

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/849,669

(22) Filed: May 4, 2001

(51) Int. Cl.[7] .................. H01L 27/01; H01L 31/062; H01L 31/113; H01L 31/119

(52) U.S. Cl. .................. 257/354; 257/289; 257/347; 257/353

(58) Field of Search ................ 257/289, 347, 257/353, 354

(56) References Cited

U.S. PATENT DOCUMENTS

| | | | | |
|---|---|---|---|---|
| 5,313,075 A | * | 5/1994 | Zhang et al. | 257/57 |
| 5,627,084 A | * | 5/1997 | Yamazaki et al. | 437/21 |
| 5,726,459 A | * | 3/1998 | Hsu et al. | 257/55 |
| 5,869,359 A | * | 2/1999 | Prabhakar | 438/149 |

OTHER PUBLICATIONS

Thin Solid Films, vol. 154, Nos. 1–2, pp. 249–255, Lausanne, CH; "Raman Microprobe Study of Silicon– and Germanium–on–Insulator Structures", I.H. Cambell et al.

* cited by examiner

Primary Examiner—Ngân V. Ngô
(74) Attorney, Agent, or Firm—Renner, Otto, Boisselle Sklar, LLP

(57) ABSTRACT

A germanium-on-insulator (GOI) device formed on a GOI structure with a buried oxide (BOX) layer disposed therein and an active layer disposed on the BOX layer having active regions defined by isolation trenches and the BOX layer. The GOI device includes a gate formed over one of the active regions. The gate defines a channel interposed between a source and a drain formed within one of the active regions.

17 Claims, 5 Drawing Sheets

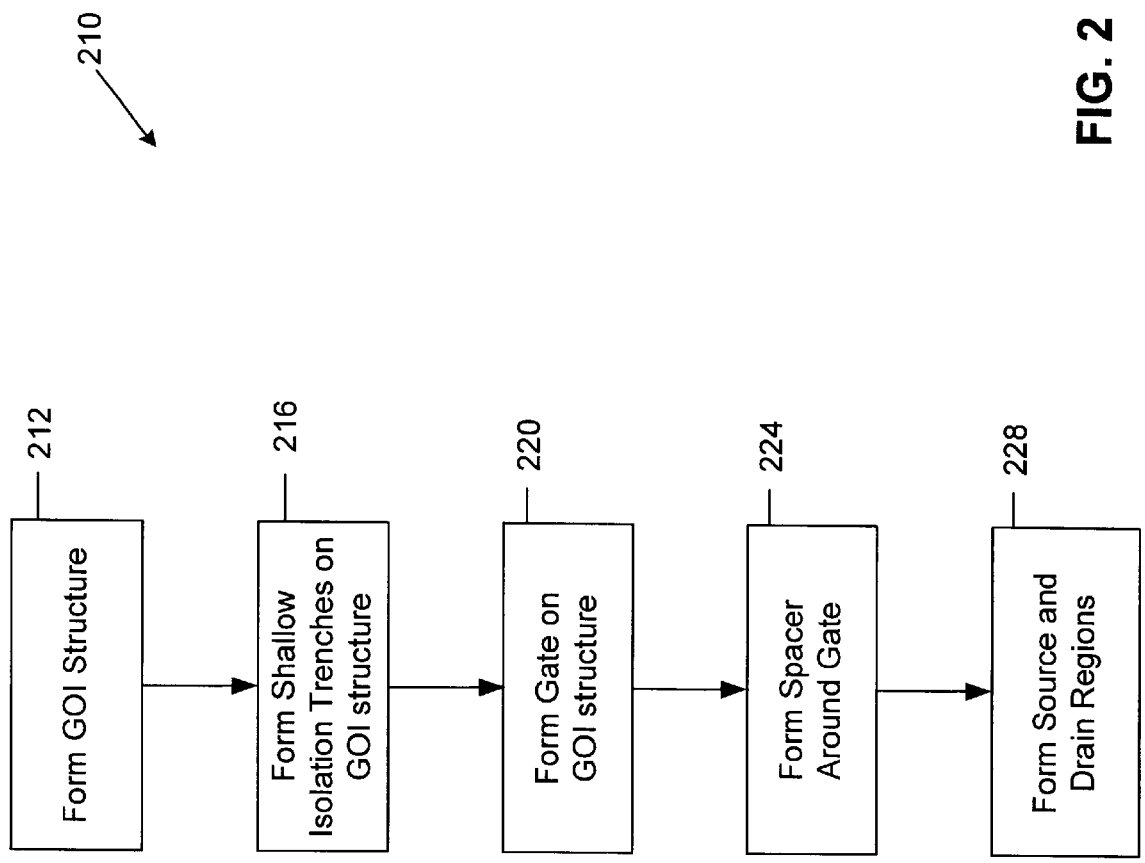

GERMANIUM-ON-INSULATOR (GOI) DEVICE

TECHNICAL FIELD

The present invention generally relates to the manufacture of semiconductor-on-insulator (SOI) devices, and, more specifically, relates to the manufacture of germanium-on-insulator (GOI) devices.

BACKGROUND ART

Traditional silicon-on-insulator (SOI) transistor devices typically have a gate defining a channel interposed between a source and a drain formed within an active region of an SOI substrate. Such SOI devices have several advantages over devices formed on conventional bulk substrates: the elimination of latch-up, improved radiation hardness, dynamic coupling, lower parasitic junction capacitance, and simplified device isolation and fabrication. Such advantages allow semiconductor device manufacturers to produce low-voltage, low-power, high-speed devices thereon. For example, metal-oxide semiconductor field effect transistors (MOSFETs) are commonly formed on SOI structures. However, MOSFETs formed on such SOI structures suffer from a short-channel effect.

The short-channel effect refers to the effect caused by reducing a "long" channel to a "short" channel. A channel length is "long" where a depletion layer formed under the channel has a depth equal to its length. When a channel length is shortened to an extreme, the depletion layer extending from the drain side spreads in the direction of the source region and contacts with the depletion layer of the source side.

As a result, a potential barrier in the vicinity of the source is lowered by the drain voltage and a current flows by itself even when no voltage is applied to the gate electrode. In this case, an energy band between the source and the drain changes continuously. This is the punch-through effect which lowers the withstand voltage between the source and the drain.

While various countermeasures have been taken to reduce the short-channel effect described above, a general measure, which has been taken most frequently, is channel-doping. Channel-doping is a technique for suppressing the short-channel effect by doping a trace amount of an impurity element such as P (phosphorus) or B (boron) shallowly in the channel region (as disclosed in Japanese Patent Laid Open Nos. Hei. 4-206971, 4-286339 and others).

However, the channel-doping technique has a drawback in that it significantly restricts the field effect mobility (hereinafter referred to simply as a mobility) of the MOSFET. That is, the movement of carriers is hampered by the intentionally doped impurity, thus dropping the mobility.

Therefore, there exists a need in the art for a device formed on a semiconductor-on-insulator structure with increased performance and better characteristics enhanced by a higher mobility of an active layer as compared to a conventional silicon layer.

SUMMARY OF THE INVENTION

According to one aspect of the invention, the invention is a germaniumon-insulator (GOI) device formed on a GOI structure. In one embodiment, the device is a MOSFET. The MOSFET device includes a gate defining a channel (e.g. a p-type doped region) interposed between a source and a drain formed within one of the active regions defined by isolation trenches and a BOX layer.

According to another aspect of the invention, the invention is a method of fabricating a GOI device on a GOI structure. The method includes the step of forming a GOI structure. Additionally, the method includes the step of forming within an active region of a GOI structure a source and a drain with a channel interposed between. The method further includes the step of forming a gate on the active region of the GOI structure.

BRIEF DESCRIPTION OF DRAWINGS

These and further features of the present invention will be apparent with reference to the following description and drawings, wherein:

FIG. 2 is a flow diagram of a method of manufacturing the GOI device according to the present invention;

DISCLOSURE OF INVENTION

Figure 1:
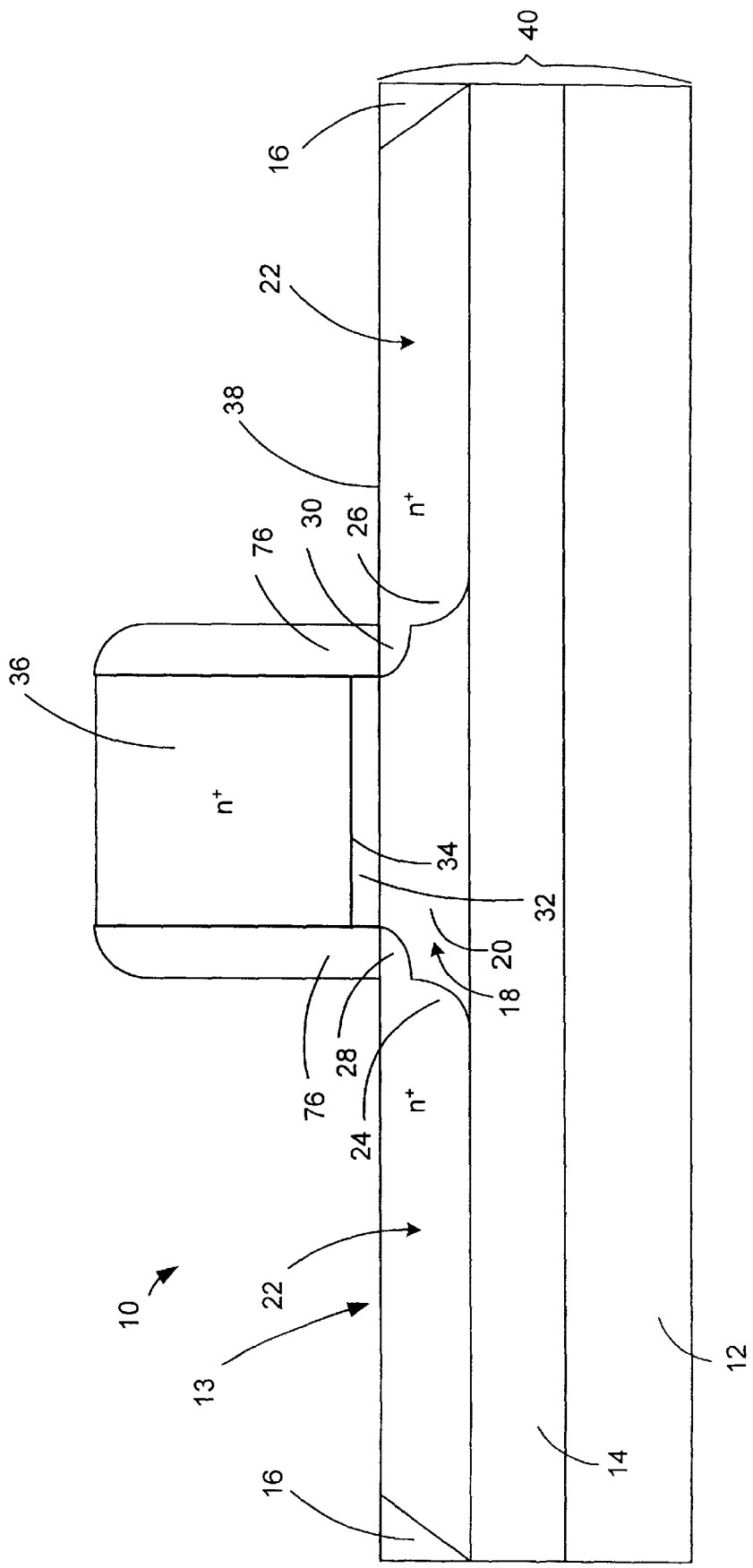
FIG. 1 is a cross-section of a GOI device according to an embodiment of the present invention.

In the detailed description that follows, identical components have been given the same reference numerals. To illustrate the present invention in a clear and concise manner, the drawings may not necessarily be to scale and certain features may be shown in a partial schematic format.

The present invention is a device, e.g. a metal-oxide field effect transistor (MOSFET), or the like, formed on a germanium-on-insulator substrate (GOI). In one embodiment, the MOSFET device comprises a gate formed on an active region of a GOI structure. The gate defines a channel, e.g. a p-type doped region, interposed between two identical deeply doped regions with lightly doped shallow extensions within the active region on the GOI structure. Interposed between the gate electrode and the channel region is a gate dielectric. The GOI device is electrically isolated horizontally by isolation trenches and vertically by a buried oxide layer.

The GOI MOSFET device described above has a significantly faster circuit speed range than traditional MOSFET devices formed on silicon-on-insulator structures. The pure germanium layer of the GOI structure has a higher mobility than a silicon layer of the conventional SOI structure. The higher mobility will improve the device performance by reducing the short-channel effect.

Referring initially to FIG. 1, an embodiment of a GOI MOSFET device 10 will now be described in more detail. The MOSFET device 10 is formed using a germanium-on-insulator (GOI) structure having a semiconductor substrate 12, a buried oxide (BOX) layer 14 formed on the semiconductor substrate 12, and a germanium layer 13 disposed on the BOX layer 14. An exemplary BOX layer 14 may have a thickness of between 500 Å and 2000 Å. Whereas, an exemplary germanium layer 13 disposed on the BOX layer 14 may have a thickness of between 100 Å and 500 Å. Suitable semiconductor materials such as silicon, carbide, germanium, or the like may be used as the semiconductor substrate 12. Within the germanium layer 13 disposed on the BOX layer 14, shallow trench isolation (STI) regions 16 define the placement of a semiconductor active region 18. The STI regions 16 are insulator-filled, e.g. with tetraethylorthosilicate (TEOS), or the like, to electrically isolate individual electrical devices such as the GOI MOSFET device 10 within respectively defined active regions. Other isolation techniques that are known in the art may be used to isolate the GOI MOSFET device 10.

In an exemplary embodiment, as illustrated in FIG. 1, the active region 18 has formed therein a p-type region, or channel 20, and two N+ regions, or a source and a drain 22. The channel 20 is interposed between the two N+ regions 22. (Alternatively, an n-type channel could be interposed between two P+ regions.) The two N+ regions 22 have respective deep implant regions 24 and 26, as well as respective extension regions 28 and 30. The active region 18 may be predoped prior to the manufacturing of the first gate of the GOI MOSFET device 10 with p-type dopants for n-type channel devices and/or ntype dopants for p-type channel devices. Alternatively, the active region 18 may be doped during the manufacturing of the first gate in a process more fully described below. An exemplary range of concentration of these dopants is between $1 \times 10^{18}$ atoms/cm$^3$ and $5 \times 10^{18}$ atoms/cm$^3$ for the p-type channel 20 and between $1 \times 10^{20}$ atoms/cm$^3$ and $2 \times 10^{20}$ atoms/cm$^3$ for the N+ regions 22.

A gate dielectric 32 is interposed between the lower surface 34 of an N+ gate electrode 36 and an upper surface 38 of a portion of the active region 18 of the GOI semiconductor substrate 40. The gate dielectric 32 illustrated in FIG. 1 is a single layer dielectric, however the gate dielectric could be a multi-layer dielectric. The gate dielectric 32 may be made of suitable gate dielectric materials, such as aluminum oxide ($Al_2O_3$), hafnium oxide ($HfO_2$), zirconium oxide ($ZrO_2$), tantalum oxide ($Ta_2O_5$), or the like. In this embodiment, dielectric layer 32 is made of $HfO_2$. An exemplary dielectric layer 32 of $HfO_2$ may have a thickness of about 30 Å. The N+ gate electrode 36 may be made of typical, well-known gate electrode materials, for example polysilicon, Si/Ge, metal or the like. An exemplary N+ gate electrode 36 may have a thickness of between 250 Å and 750 Å.

It will be appreciated that the active region 18, the channel region 20, the source and the drain 22, the gate dielectric 32, and the N+ gate electrode 36, together form the GOI MOSFET device of the present invention. The principles of operation of a MOSFET are well known. It will further be appreciated that the MOSFET device 10 may alternatively have other shapes than the shape shown in FIG. 1.

Spacers 76 extend upward from the upper surface 38 of the GOI structure 40 on either side of the gate electrode 36. The spacers 76 extend substantially to the top of the gate electrode 36. Exemplary spacers 76 may have a height of between 260 Å and 760 Å.

Although the illustrated device is a MOSFET device on a GOI structure, other devices on GOI structures, can also be improved using the higher mobility characteristics of the GOI structure described herein.

Figure 3A:
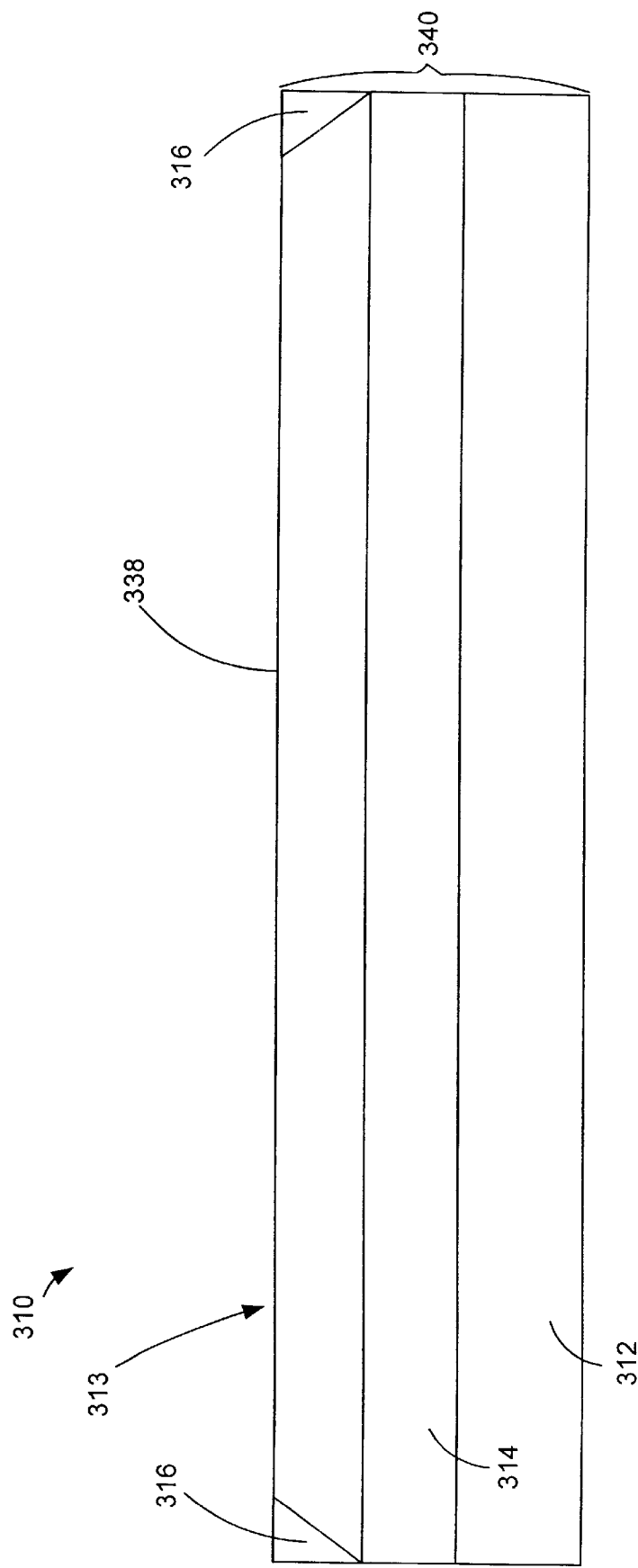
FIG. 3A is a cross-section of the GOI device according to the present invention in a first intermediate stage of manufacture.
Figure 3B:
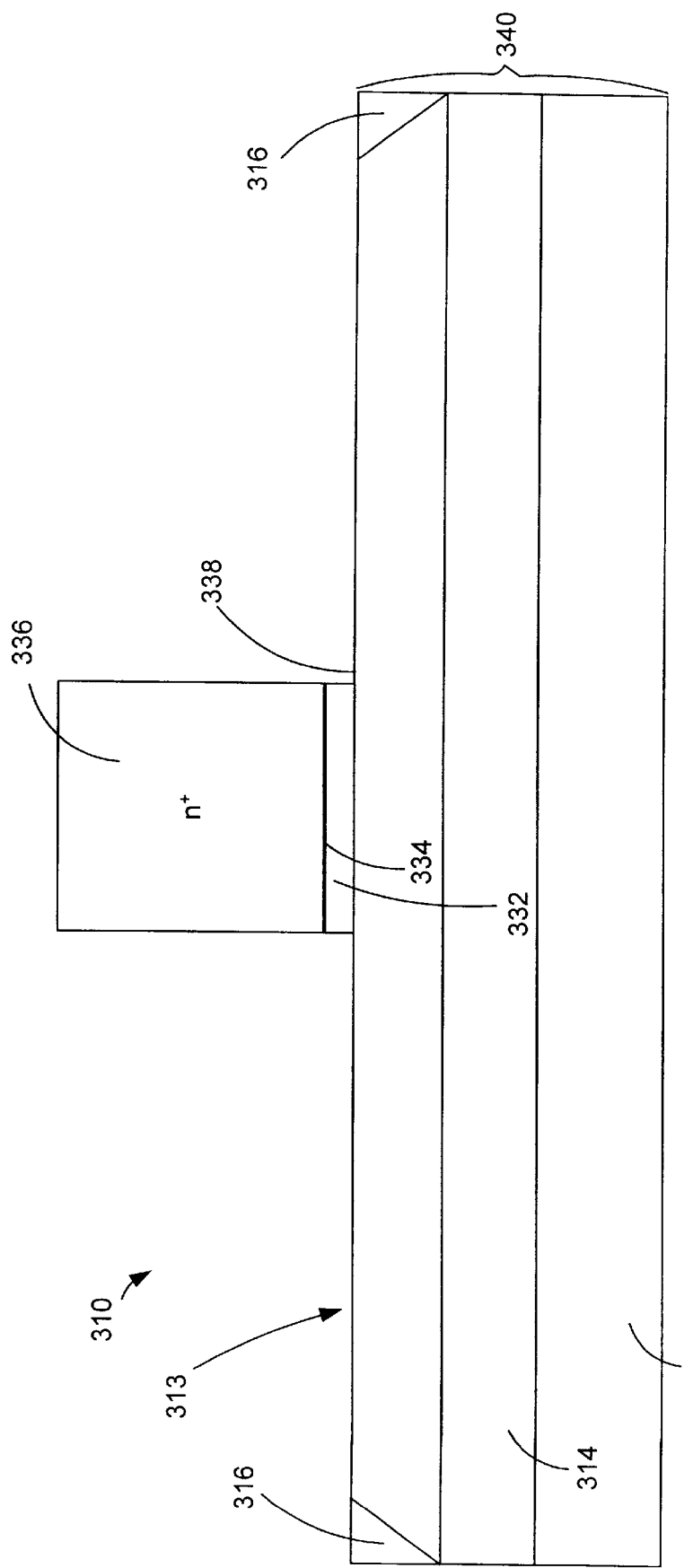
FIG. 3B is a cross-section of the GOI device according to the present invention in a second intermediate stage of manufacture.
Figure 3C:
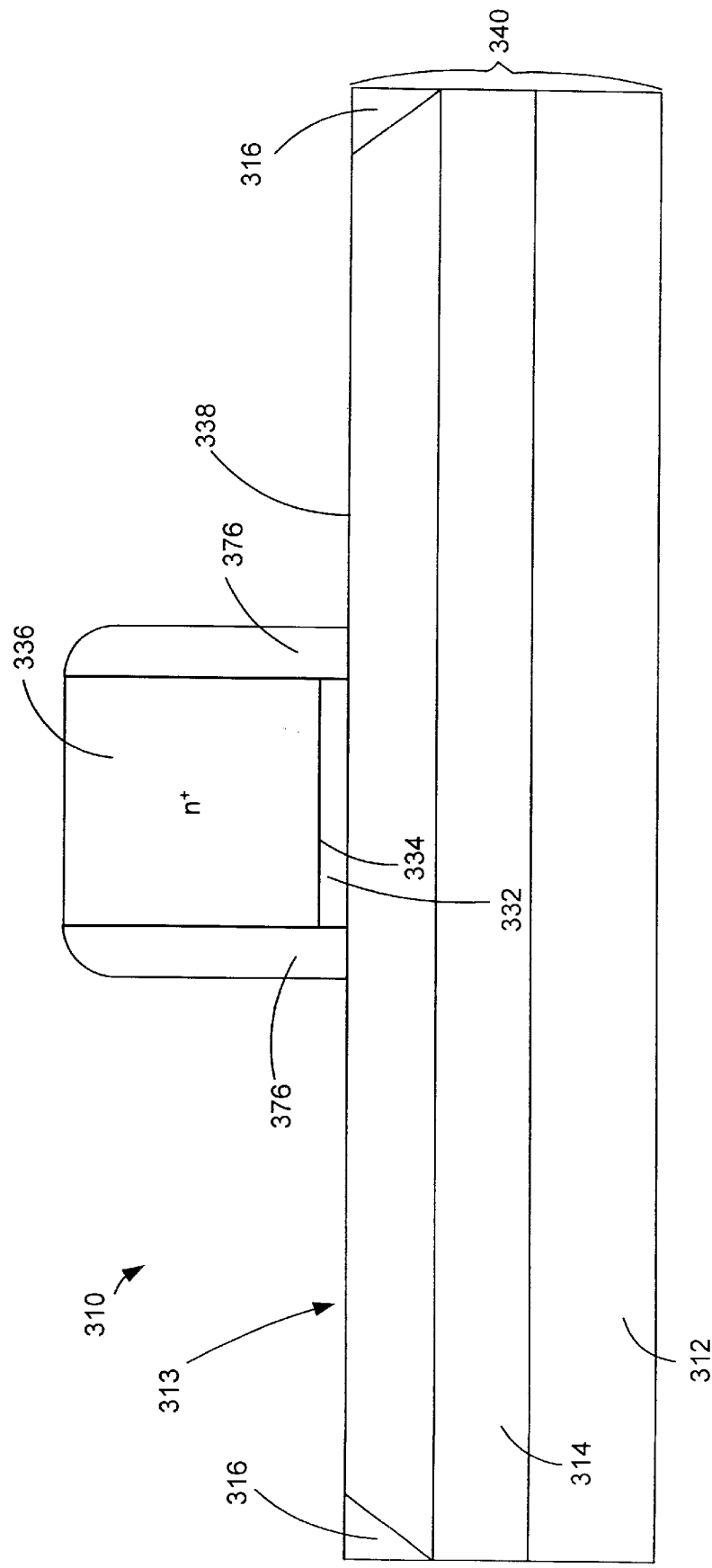
FIG. 3C is a cross-section of the GOI device according to the present invention in a third intermediate stage of manufacture.

The steps of a method 210 for fabricating a GOI device 310 (which may be similar to the GOI device 10 described above) are outlined in the flow chart shown in FIG. 2. FIGS. 3A–3C illustrate various steps of the method 210. It will be appreciated that the method 210 and the semiconductor device 310 described below are merely exemplary, and that suitable embodiments of the many above-described variations in materials, thicknesses, and/or structures may alternatively be used in the method 210 and/or the semiconductor device 310.

In step 212 of the method 210, a GOI structure 340 is formed. The GOI structure 340 may be formed by wafer bonding technique described below. An oxide layer is formed on a first (handle substrate) semiconductor substrate. The handle substrate may be of silicon, germanium, or other similar semiconductive material. For the exemplary embodiment a silicon substrate is used. The oxide layer can be any oxide layer such as silicon dioxide ($SiO_2$), aluminum oxide ($Al_2O_3$), silicon oxynitride (SiON), or the like. A chemical or thermal process may be used to form the oxide layer. In one embodiment, a silicon dioxide is thermally grown on the handle substrate. Next, a germanium (Ge) wafer has an oxide such as silicon dioxide chemically vapor deposited (CVD) thereon. Then, one of the substrates, e.g. the Ge wafer, is flipped over such that the oxide layers are in contact. The Ge wafer is then wafer bonded to the silicon substrate at the $SiO_2$ interface. A thermal fusing process may be used at this time to more securely fuse the GOI structure. A silicon oxide or the like is used because germanium oxide is unstable. The resulting GOI structure 340 includes a semiconductor substrate 312, a BOX layer 314 formed on the semiconductor substrate 312 and a germanium layer 313 disposed on the BOX layer 314. An exemplary BOX layer may have a thickness of between 500 Å and 2000 Å. Whereas, an exemplary germanium layer 313 disposed on the BOX layer 314 may have a thickness of between 100 Å and 500 Å. It should be understood that other techniques may be used to form the GOI structure 340.

In step 216 within the semiconductor layer 313 disposed on the BOX layer 314, shallow trench isolation (STI) regions 316 which define the placement of a semiconductor active region 318 are formed. The STI regions 316 are insulator-filled to electrically isolate individual electrical devices such as a MOSFET device 310. The STI regions are formed by forming trenches in the GOI structure 340. Next the germanium is oxidized to round off the corners. Then, the oxide is removed during a water rinse. This is followed by a deposition of TEOS which is polished back to the top surface 338 of the germanium layer 313 to form the STI regions 316. Other isolation techniques that are known in the art may be used to isolate the MOSFET device 310. The polishing is done using conventional techniques, which are well-known in the art. It will be appreciated that the insulator-filled isolation trenches 316 may be formed in a later step in the method, rather than being formed as part of the intermediate device shown in FIG. 3A.

Next in step 220, a gate is formed on the GOI structure 340. A gate dielectric 332 is interposed between the lower surface 334 of an N+ gate electrode 336 and an upper surface 338 of the GOI semiconductor substrate 340 as shown in FIG. 3B. The gate dielectric 332 illustrated in FIG. 3B is a single layer dielectric, however the gate dielectric could be a multi-layer dielectric. The gate dielectric 332 may be made of suitable gate dielectric materials, such as aluminum oxide ($Al_2O_3$), hafnium oxide ($HfO_2$), tantalum oxide ($Ta_2O_5$), zirconium oxide ($ZrO_2$), or the like. In this embodiment, dielectric layer 322 is made of $HfO_2$. An exemplary dielectric layer 332 of $HFO_2$ may have a thickness of about 30 Å. The N+ gate electrode 336 may be made of typical, well-known conductive materials, for example polysilicon, Si/Ge, metal or the like. An exemplary N+ gate electrode 336 may have a thickness of between 250 Å and 750 Å.

On top of the N+ gate electrode 336 an optional oxide layer may be formed (not shown). The oxide layer may be made of silicon dioxide (SiO$_2$) or any of a variety of suitable materials for use in a later step to protect portions of the gate electrode 336 from an etchant. It will be understood that the use of the term oxide with regard to the oxide layer or portions thereof, encompasses the variety of suitable well-known materials for protecting the gate electrode 336. The oxide deposition may be performed, for example, by plasma enhanced chemical vapor deposition (PECVD). An exemplary oxide layer may have a thickness of between 10 Å and 20 Å.

Next in step 224, spacers 376 are formed around the gate, as illustrated in FIG. 3C. Spacers 376 extend upward from the upper surface 338 of the GOI structure 340 on the sides of the gate electrode 336. Exemplary spacers 376 may have a height of between 260 Å and 760 Å.

Step 228 follows spacer 376 formation with the implanting of regions of the semiconductor substrate 340, which may be performed during the gate device formation as described below. The implants produce source and drain N+ regions 322 in the substrate 340. A channel region 320 defined by the gate, between the source and the drain 322 remains p-type doped.

The source and the drain regions 322 have respective source and drain deep implant regions 324 and 326, and may have respective source and drain extensions 328 and 330 if desired. The source and drain regions may be formed by a combination of implants, such as main perpendicular implants and extension perpendicular implants.

If the extensions 328 and 330 are desired these are formed after the gate is formed and prior to formation of the spacers 376. An extension perpendicular implant may be performed at this time. The extension perpendicular implant is a relatively low energy, low concentration implant which is capable of producing the source and drain extensions 328 and 330. The total concentration of the extension implants may be, for example, between $1 \times 10^{19}$ atoms/cm$^3$ and $1 \times 10^{20}$ atoms/cm$^3$. The extension perpendicular implants may be of the same material as the main perpendicular implant, or may alternatively include different materials. However, it will be appreciated that the extension implants may be different from one another, if so desired.

The main source and drain regions may be formed after spacer 376 formation by a main perpendicular implant, which will not affect the extension implant due to the spacers 376 acting as masks. The main perpendicular implant is a relatively high energy, high concentration implant which is capable of producing the source and drain deep implant regions 324 and 326. An exemplary range of implant dose for the perpendicular implant is between $1 \times 10^{15}$ atoms/cm$^2$ and $2 \times 10^{15}$ atoms/cm$^2$.

Although the extension implantation and the main implantation are illustrated as each involving one implant, it will be appreciated that a greater number of implants may be employed. Further, halo implants may be used in forming the extension implantation after gate patterning or/and spacer 376 formation. For example, tilt angle extension implants (35–45 degrees) implanting In or BF2 utilizing four rotations for a total implantation dose of between $3.5 \times 10^{13}$ atoms/cm$^2$ and $5 \times 10^{13}$ atoms/cm$^2$ with energies between 30–80 keV.

It will be appreciated that many alternative sequences or steps may be used to accomplish the implantation. For example, the extension implants may be performed before the formation of the gate dielectric 332 upon the SOI substrate 340 by conventional, well-known methods and means.

After implantation, the semiconductor device 310 is subjected to rapid thermal annealing (RTA). Exemplary RTA may be performed for between five and fifteen seconds at a temperature of 1,020° C.–1,050° C.

Although particular embodiments of the invention have been described in detail, it is understood that the invention is not limited correspondingly in scope, but includes all changes, modifications and equivalents coming within the spirit and terms of the claims appended hereto.

What is claimed is:

1. A germanium-on-insulator (GOI) device formed on a GOI structure with a semiconductor substrate, a buried oxide (BOX) layer disposed thereon and an active layer disposed on the BOX layer having active regions defined by isolation trenches and the BOX layer and wherein the GOI device has a gate that includes; a gate electrode; and a gate dielectric layer interposed between the gate electrode and the active layer; wherein the gate dielectric layer includes a gate dielectric material with a permittivity greater than silicon-dioxide (SiO$_2$).

2. The GOI device according to claim 1, wherein the device is a metal-oxide on semiconductor field effect transistor (MOSFET).

3. The GOI device according to claim 1, wherein the BOX layer is silicon dioxide (SiO2).

4. The GOI device according to claim 1, wherein the isolation trenches are TEOS.

5. The GOI device according to claim 1, wherein the gate defines a channel interposed between a source and a drain formed within one of the active regions of the GOI structure.

6. The GOI device according to claim 5, wherein the source and the drain are identically doped.

7. The GOI device according to claim 5, wherein the source and the drain are N+ doped.

8. The GOI device according to claim 5, wherein the gate is formed before the source and the drain.

9. The GOI device according to claim 5, wherein the source and the drain are formed before the gate.

10. The GOI device according to claim 1, wherein the gate electrode is polysilicon.

11. The GOI device according to claim 1, wherein the semiconductor substrate material is silicon (Si), geranium (Ge) or any other semiconductor material.

12. The GOI device according to claim 10, wherein the gate electrode is N+ doped.

13. The GOI device according to claim 1, wherein the gate dielectric material is one or more of aluminum oxide (Al$_2$O$_3$), hafnium oxide (HfO$_2$), zirconium oxide (ZrO$_2$), or tantalum oxide (Ta$_2$O$_5$).

14. The GOI device according to claim 1, wherein the gate dielectric is one or more of hafnium oxide (HfO$_2$) or zirconium oxide (ZrO$_2$).

15. The GOI device according to claim 1, wherein the BOX layer is one or more of silicon dioxide (SiO$_2$), aluminum oxide (Al$_2$O$_3$), silicon oxynitride (SiON), or any other oxide material.

16. A GOI device according to claim 5, wherein the source has a source extension and the drain has a drain extension.

17. A GOI device according to claim 1, wherein the source has a source extension and the drain has a drain extension.

* * * * *